(12) United States Patent
Farkas et al.

(10) Patent No.: US 11,805,594 B2
(45) Date of Patent: Oct. 31, 2023

(54) INFORMATION HANDLING SYSTEM WITH SPLIT TRACE FOR HIGH SPEED ROUTING

(71) Applicant: DELL PRODUCTS, LP, Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 126 days.

(21) Appl. No.: 16/984,592

(22) Filed: Aug. 4, 2020

(65) Prior Publication Data
US 2022/0046790 A1 Feb. 10, 2022

(51) Int. Cl.
*H05K 1/02* (2006.01)
*H01L 23/66* (2006.01)

(52) U.S. Cl.
CPC ........... *H05K 1/0245* (2013.01); *H01L 23/66* (2013.01); *H05K 1/025* (2013.01); *H05K 1/0219* (2013.01); *H01L 2924/3011* (2013.01); *H05K 2201/09727* (2013.01)

(58) Field of Classification Search
CPC ...... H05K 1/0245; H05K 1/0219; H05K 1/25; H01L 23/66
See application file for complete search history.

(56) References Cited

U.S. PATENT DOCUMENTS

| | | | |
|---|---|---|---|
| 5,621,366 A * | 4/1997 | Gu | H01P 7/084 333/204 |
| 5,922,650 A * | 7/1999 | Ye | H01P 7/082 505/703 |
| 9,425,149 B1 | 8/2016 | Jiang et al. | |
| 10,375,822 B2 | 8/2019 | Li et al. | |
| 2004/0159460 A1* | 8/2004 | Passiopoulos | H05K 1/0237 174/117 FF |
| 2014/0055702 A1* | 2/2014 | Park | H01L 27/3279 257/40 |
| 2020/0098816 A1* | 3/2020 | Matsumoto | H05K 1/181 |

* cited by examiner

*Primary Examiner* — Samuel S Outten
(74) *Attorney, Agent, or Firm* — Larson Newman, LLP

(57) ABSTRACT

An apparatus includes a first conductor trace arranged to electrically couple a first complementary signal to provide differential signaling. The first conductor trace includes a first plurality of split traces to conduct the first complementary signal, and a first plurality of tie bars to connect the first split traces.

12 Claims, 9 Drawing Sheets

INFORMATION HANDLING SYSTEM WITH SPLIT TRACE FOR HIGH SPEED ROUTING

FIELD OF THE DISCLOSURE

This disclosure generally relates to information handling systems, and more particularly relates to a split trace for high speed routing.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An apparatus includes a first conductor trace arranged to electrically couple a first complementary signal to provide differential signaling. The first conductor trace may include a first plurality of split traces to conduct the first complementary signal, and a first plurality of tie bars to connect the first split traces.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
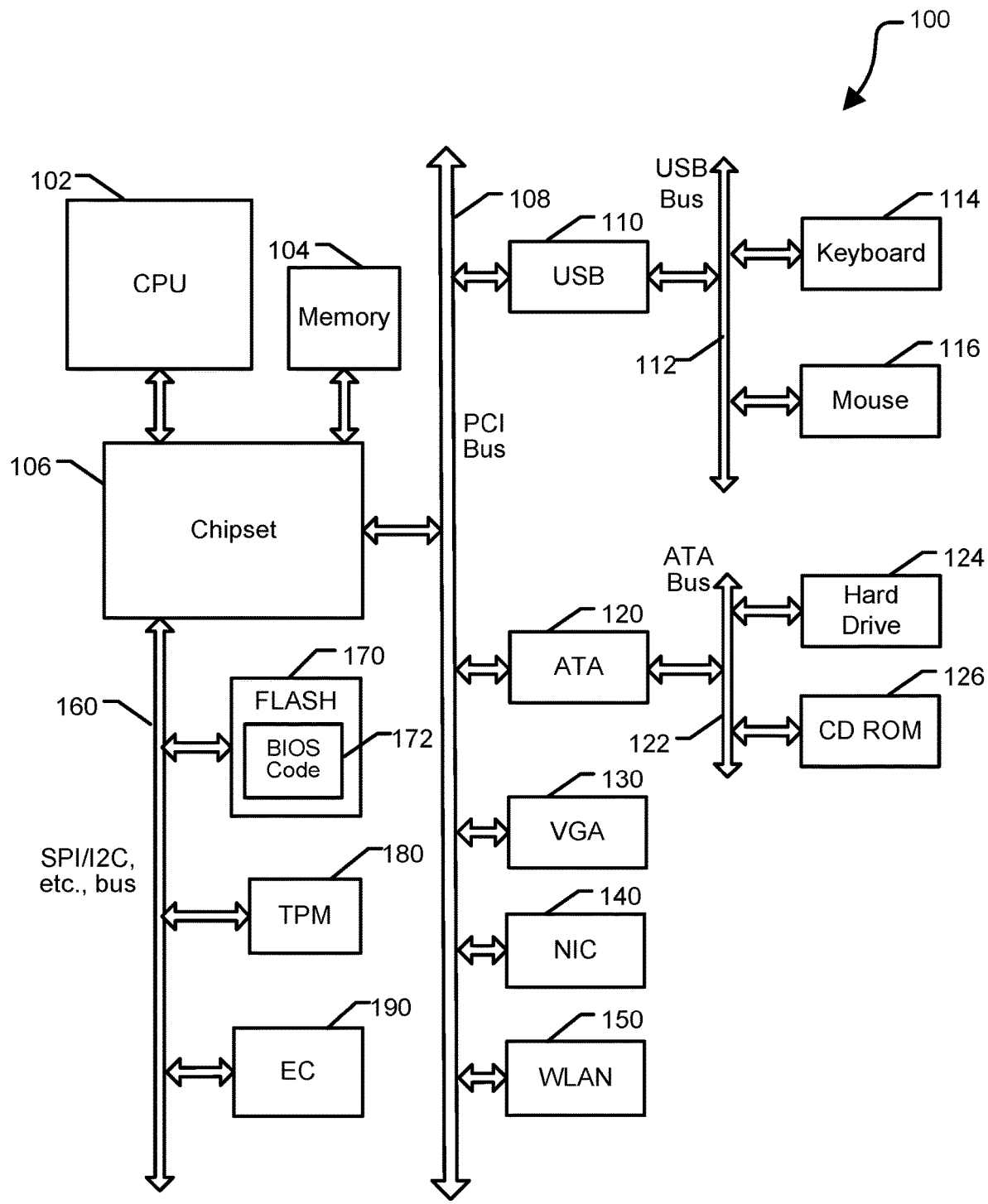
FIG. 1 is a block diagram of an information handling system according to a specific embodiment of the present disclosure.

FIG. 1 illustrates an information handling system 100 including a processor 102, a memory 104, a chipset 106, a Peripheral Component Interconnect (PCI) bus 108, a Universal Serial Bus (USB) controller 110, a USB 112, a keyboard device 114, a mouse device controller 116, an Advanced Technology Attachment (ATA) bus controller 120, an ATA bus 122, a data storage device 124, a compact disk read only memory (CD ROM) device 126, a video graphics array (VGA) device 130, a display device 131, a network interface controller (NIC) 140, a wireless local area network (WLAN) controller 150, one or more serial busses 160, a non-volatile rand access memory (NVRAM) 170 for storing a basic input/output system (BIOS) 172, a Trusted Platform Module (TPM) 180, and an embedded controller (EC) 190.

NVRAM 170 can be referred to as a serial peripheral interface (SPI) flash storage device, BIOS SPI, and the like. TPM 180 is configured to ensure that the boot process starts from a trusted combination of hardware and software, and continues until the operating system has fully booted and applications are running. TPM 180 is compliant with an international standard for a secure cryptoprocessor, a dedicated microcontroller designed to secure hardware through integrated cryptographic keys. EC 190 can be referred to as a service processor, a baseboard management controller (BMC), and the like. EC 190 includes a processor that can operate out-of-band with respect to CPU 102. For example, remote management systems can utilize EC 190 to access components at information handling system independent of an operating state of CPU 102. EC 190 may be responsible for performing low level hardware tasks including thermal management and power management operations.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and one ore more components can be integrated together. For example, portions of chipset 106 can be integrated within CPU 102. In an embodiment, chipset 106 can include a platform controller hub (PCH). System 100 can include additional buses and bus protocols. Serial bus 160 is representative of one or more busses and/or bus protocols, such as a serial peripheral interface (SPI) bus, an inter-integrated circuit protocol (I2C) bus, a system management bus (SMB), a power management bus (PMBus), and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

BIOS 172 includes instructions executable by CPU 102 to initialize and test the hardware components of system 100, and to load a boot loader or an operating system (OS) from a mass storage device. BIOS 172 additionally provides an abstraction layer for the hardware, that is a consistent way for application programs and OS to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device. In an embodiment, BIOS 172 can provide one or more runtime processes or device drivers that are configured to support functionality disclosed herein. After the initialization procedure is complete and an operating system is loaded, such as Windows, computational operation of information handling system can begin. In an embodiment, the BIOS 172 can be substantially compliant with one or more revisions of the UEFI specification.

Many circuits included in an information handling system operate at very high frequencies, including memory interfaces such as SATA and DDR, peripheral interfaces such as USB and PCI, and the like. As signal frequencies approach and exceed one GHz, a physical phenomenon known as "skin effect" becomes a design concern. Skin effect is the tendency of an alternating electric current to become distributed within a conductor such that the current density is largest near the surface of the conductor, and decreases with greater depths in the conductor. The electric current flows mainly at the "skin" of the conductor, between the outer surface and a level called the skin depth. The skin effect causes the effective resistance of the conductor to increase at higher frequencies where the skin depth is smaller, thus reducing the effective cross-section of the conductor. The skin effect is due to opposing eddy currents induced by the changing magnetic field resulting from the alternating current. Skin effect is exhibited in all conductors, including wires and conductor traces that carry signals at a printed circuit board (PCB). In addition to $I^2R$ loss due to skin effect, other losses contribute to reduced signal integrity, including dielectric loss and radiation. Interference caused by coupling of noise from other signal conductors can further degrade signal integrity, resulting in lower data transfer performance. FIGS. 2-9 illustrate techniques for reducing dielectric and conductor losses in PCB traces and integrated circuit package traces without reducing routing density.

Figure 2:
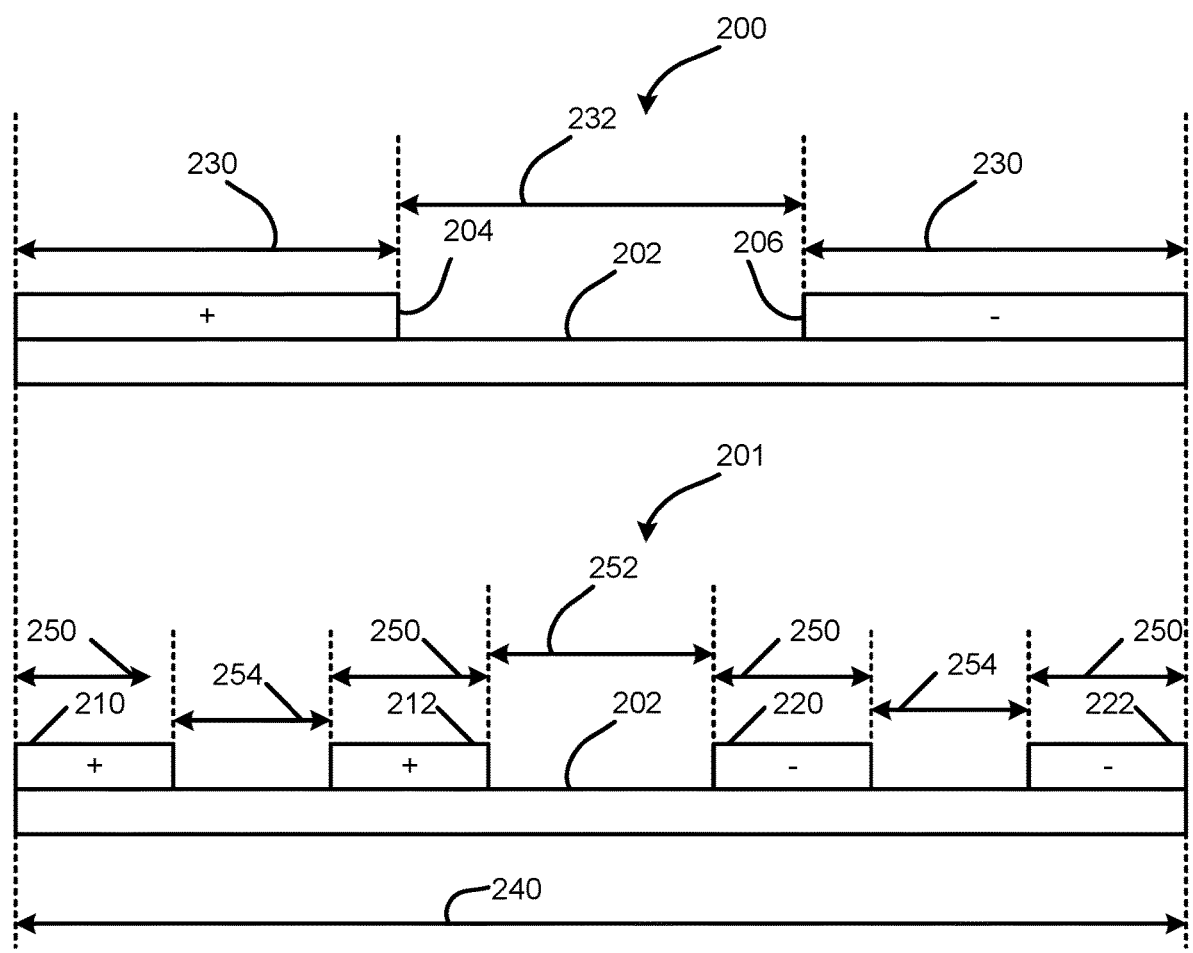
FIG. 2 is a block diagram illustrating two implementations of traces at a printed circuit board for conducting high frequency differential signals according to a specific embodiment of the present disclosure.

FIG. 2 illustrates conductor trace implementations 200 and 201 on a printed circuit board (PCB) 202 for conducting high frequency differential signals according to a specific embodiment of the present disclosure. PCB 202 may represent any PCB included at information handling system 100 or a peripheral device associated with system 100. PCB 202 may also represent a dielectric and routing layer included at an integrated circuit package. Differential signaling is a method for electrically transmitting information using two complementary signals. The technique sends two complementary signals, referred to herein as a differential pair of signals. Differential signaling provides significantly better signal integrity than is possible with a single conductor.

Conductor trace implementation 200 includes PCB 202 including conductor traces 204 and 206 for carrying a first differential signal pair. In an example, conductor traces 204 and 206 may be routed on PCB 202 in any suitable manner known in the art. In certain examples, each of conductor traces 204 and 206 may be configured to carry different signal of a differential signal pair. For example, conductor traces 204 may be configured to carry a first signal of a differential signal pair, identified by a "+" sign, and trace 206 may be configured to carry a second signal of a differential signal pair, identified by a "−" sign.

FIG. 2 also shows dimensions and spacing of the PCB features, in units of mils. For example, both conductor traces 204 and 206 may have a width 230 and the conductor traces may be separated by a width 232. In an example, width 230 of conductor traces 204 and 206 may be any suitable width including, but not limited to, six mils, eight mils, and ten mils. Width 232 between conductor traces 204 and 206 may be separated by any suitable width, such as six mils, six and a half mils, and eight mils. Accordingly, a total space or width 240 required for a single differential pair of conductor trace implementation 200 may be in a range of 18-28 mils. The dimensions of the conductor traces and spacing dimensions may contribute to a characteristic impedance of the differential signal path. For example, the characteristic impedance of the PCB signal path provided by traces 204 and 206 may be any suitable amount, such as 85 ohms. However, width 230 of conductor traces may cause dielectric losses and conductor losses. In an example, a conductor trace may be divided into two or more split traces, which in turn may improve an information handling system including PCB 202 by achieving a lower dielectric loss and a lower conductor loss without adding cost or reducing routing density in the PCB as will be described herein.

Conductor trace implementation 201 may be formed by to conductor traces being routed on PCB 202. Upon the conductor traces being routed, both of the conductor traces may be split into two or more split traces in any suitable manner. For example, conductor trace implementation 201 illustrates PCB 202 including multiple split traces 210, 212, 220, and 222. In an example, one conductor trace of a differential pair may be divided into split traces 210 and 212, and another conductor trace of the differential pair may be divided into split traces 220 and 222. In certain examples, the conductor traces may be divided into any suitable number of split traces including, but not limited to, two splits, three splits, and four splits. Both of split traces 210 and 212 may be configured to carry the same signal as the conductor trace, from which the split traces were formed. For example, both of split traces 210 and 212 may be configured to carry a first signal of a differential signal pair, identified by a "+" sign. Similarly, both of split traces 220 and 222 may be configured to carry the same signal as the conductor trace, from which the split traces were formed. For example, each of split traces 220 and 222 may be configured to carry a second signal of the differential signal pair, identified by a "−" sign, complementary, signal of the differential signal pair, sometimes referred to as a return current.

FIG. 2 further illustrates the dimensions for PCB 202 with split traces 210, 212, 220, and 222. In an example, all of split traces 210, 212, 220 and 222 may have a width 250. For example, width 230 of split traces 210, 212, 220 and 222 may be any suitable width including, but not limited to, one mil, one and a half mils, two mils, two and a half mils, and three mils. In certain examples, split traces 212 and 220 may be separated by a width 252. In this example, width 252 may be the width between split traces configured to carry different signals of the differential signal pair. For example, the combination of split traces 210 and 212 may be separated from the combination of split traces 220 and 222 by any suitable width 252 including, but not limited to, three and a half mils, four mils, and four and a half mils. As stated above, split traces 220 and 222 may carry a return current from split traces 210 and 212. In an example, width 252 may allow proximity of the adjacent return currents, such that end conductors present less electromagnetic (EM) fringing as compared to trace conductors 204 and 206. In response to the less amount of EM fringing, the differential signal provided on split conductors 210, 212, 214, and 216 may have reduced coupling with an adjacent differential signal, which in turn may be utilized as lower crosstalk between signals, increased routing density on PCB 202, or the like.

In an example, split traces 210 and 212 may be separated by a width 254. Similarly split traces 220 and 222 may also be separated by width 254. Width 254 may be any suitable width including, but not limited to, one mil, one and a half mils, two mils, two and a half mils, three mils, and three and a half mils. In an example, if widths 250, 252, and 254 may be selected to make width 240 of a single differential pair of conductor trace implementation 201 substantially the same as the width for a single differential pair within conductor trace implementation 200. For example, if widths 250 and 254 are both two and a half mils, and width 252 is three and a half mils, the total space or width a single differential pair of conductor trace implementation 201 may be substantially the same as the width for a single differential pair of conductor trace implementation 200 with width 230 being six mils and width 232 being six and a half mils, such that width 240 is 18.5 mils.

The particular dimensions illustrated at FIG. 2 are provided merely for example and comparison, such as corresponding to current design rules when using relatively inexpensive PCB dielectric materials. Today, trace widths and spacing of two and a half mils is possible for a typical PCB. Smaller feature sizes and spacing may be possible, perhaps requiring dielectric material having relatively lower loss properties, as compared to larger conductor traces, such as conductor traces 204 and 206. Furthermore, the dimensions of traces and spacing included within an integrated circuit package may be significantly smaller, such as 0.2 mils. In addition, the vertical dimensions shown at FIG. 2 are exaggerated for clarity. In an example, the smaller width 250 of split traces 210, 212, 220, and 222 does not result in an increase signal loss proportional to the decrease in the width as compared to width 230 of conductor traces 204 and 206, as shown in FIG. 3.

Figure 3:
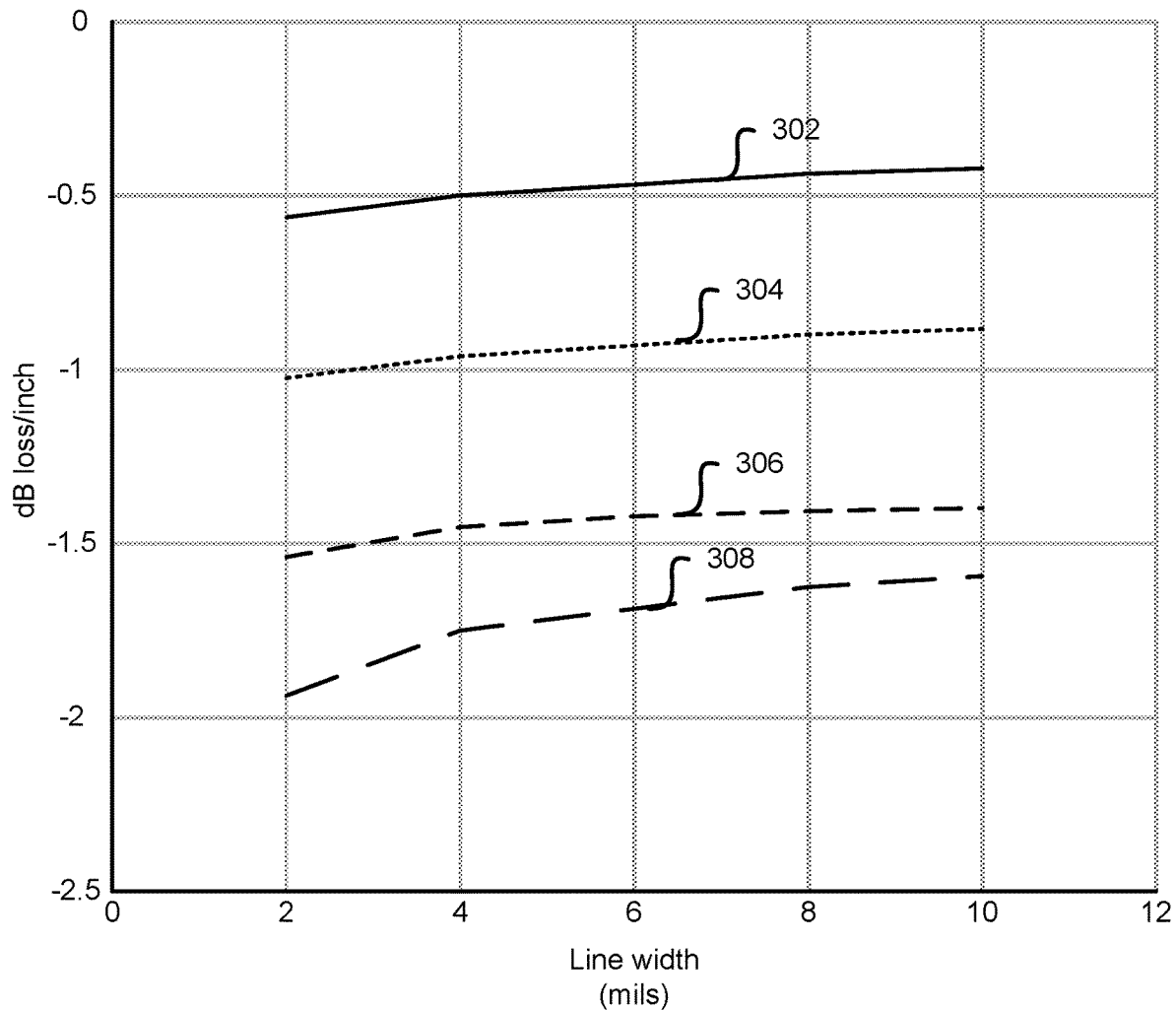
FIG. 3 illustrates multiple wave forms associated with conductor traces according to specific embodiments of the present disclosure.

FIG. 3 shows multiple wave forms 302, 304, 306, and 308 associated with conductor traces according to specific embodiments of the present disclosure. In an example, waveform 302 represents losses in a 4 GHz signal for different conductor trace line widths. In this example, a 4 GHz signal loses just above 0.5 dB/inch of trace length when the width of the conductor trace is 2 mils, and just below 0.5 dB/inch of trace length when the width of the conductor trace is 6 mils. Waveform 304 represents losses in an 8 GHz signal for different conductor trace line widths. In this example, an 8 GHz signal loses just above 1 dB/inch of trace length when the width of the conductor trace is 2 mils, and about 0.9 dB/inch of trace length when the width of the conductor trace is 6 mils. Waveform 306 represents losses in a 12 GHz signal for different conductor trace line widths. In this example, a 12 GHz signal loses just above 1.5 dB/inch of trace length when the width of the conductor trace is 2 mils, and about 1.4 dB/inch of trace length when the width of the conductor trace is 6 mils. Waveform 308 represents losses in a 16 GHz signal for different conductor trace line widths. In this example, a 16 GHz signal loses just below 2 dB/inch of trace length when the width of the conductor trace is 2 mils, and about 1.7 dB/inch of trace length when the width of the conductor trace is 6 mils. Thus, in an example, if split traces 210, 212, 220, and 222 of FIG. 2 have a width of 2.5 mils, the additional loss as compared to conductor traces 204 and 206 having a width of 6 mils will only be about 0.1 dB/inch of trace length. As shown in FIG. 3, dielectric losses are not directly proportional to copper/trace surface area, but are controlled more by the frequency of the signal as shown by waveforms 302, 304, 306, and 308.

Figure 4A:
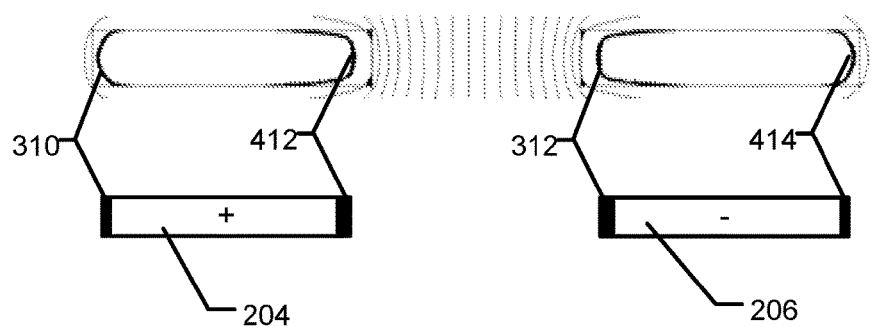
FIGS. 4a and 4b are block diagrams illustrating skin effects at conductor traces of a printed circuit board according to a specific embodiment of the present disclosure.
Figure 4B:
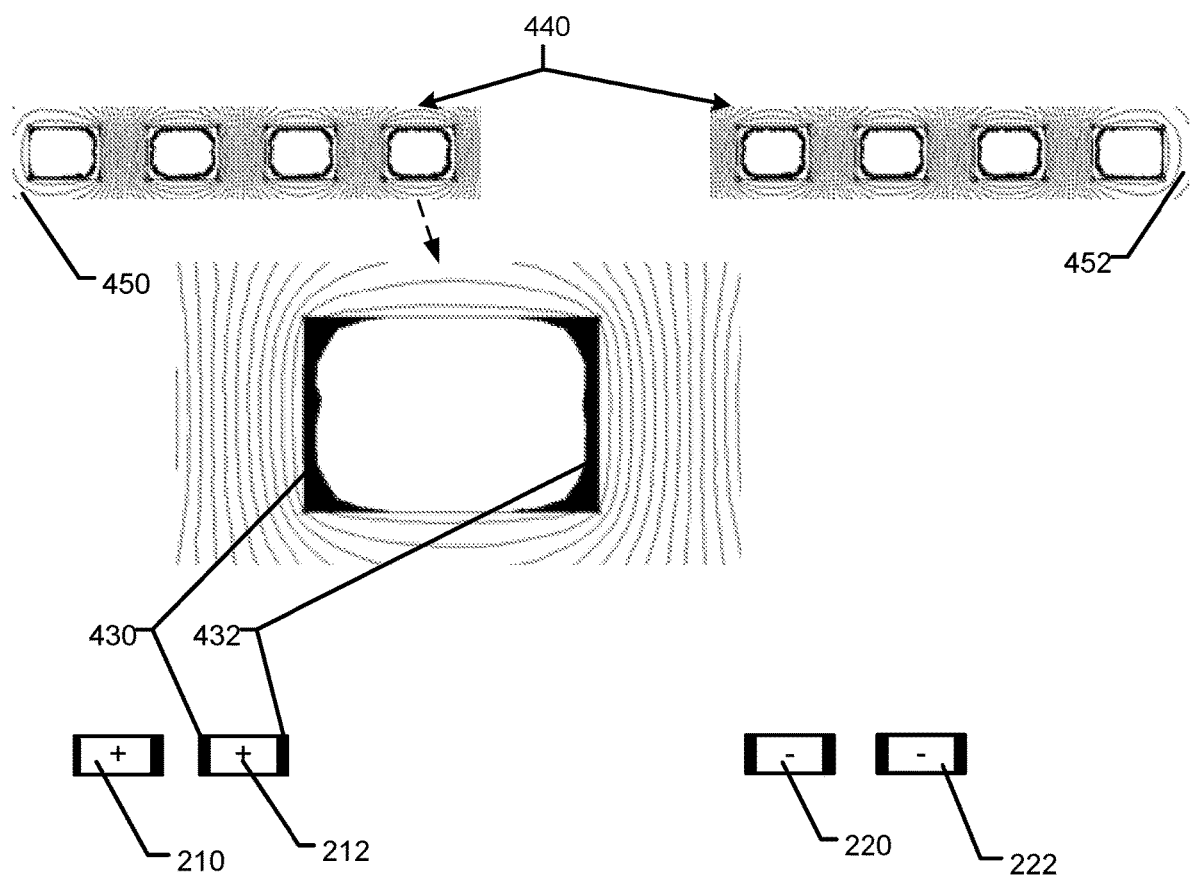

FIGS. 4a and 4b show how skin effect reduces the current-carrying capacity of a conductor trace according to a specific embodiment of the present disclosure. FIG. 4a shows conductor traces 204 and 206 of FIG. 2 with an added representation of magnetic field lines and skin depth induced in the traces by signal currents carried by the traces. In particular, the darkened areas identified by references 410, 412, 412, and 414 indicate where a majority of signal current is conducted. When only two relatively wide traces are used to couple a differential signal, the intensity of magnetic field lines extend relatively far to the left and right of the conductors, requiring a relatively greater isolation distance to a next signal trace. At low frequencies, substantially the full cross section of each conductor trace can conduct current. At high frequencies, currents prefer the sides of the conductor traces that results in lowest inductance, and a majority of the conductor trace is effectively wasted. FIG. 4a also illustrates that the edges of the trace conductors that are closest to their mutual return currents (between the two traces) exhibit greater current flow than at the outer edges (left and right sides).

FIG. 4b shows split traces 210, 212, 220, and 222 of FIG. 2 with an added representation of magnetic field lines and skin depth induced in the traces by signal currents carried by the traces. In particular, the darkened areas identified by references 420 and 422 indicate where a majority of signal current is conducted. By utilizing additional, replicated, conductor traces arranged with alternating differential polarity, the total skin depth is increased relative to that of having only two traces shown at FIG. 4a. Furthermore, each of the replicated conductor traces is now carrying less current, as the total current is distributed across multiple conductors. Accordingly, relatively strong magnetic field lines around each of the narrower, replicated, conductors do not extend as far away from each trace. Reference 440 shows an example with four split traces for each signal of a differential signal, and references 450 and 452 illustrate reduced electromagnetic fringing at the left and right side of the set of traces, thereby allowing an isolation space to adjacent unrelated signal traces to be reduced.

Referring back to FIG. 2, split traces 210, 212, 220, and 222 may utilize the characteristics for conductor traces described above with respect to FIGS. 3, 4a, and 4b to improve routing on PCB 202 and improve signal transmission in an information handling system. For example, split traces 210, 212, 220, and 222 may increase conducting area as compared to a single trace for each signal of a different signal. In an example, the smaller conductor traces of split traces 210, 212, 220, and 222 may occupy an overall area that is the same as only two conductor traces. Split traces 210, 212, 220, and 222 now utilize more 'effective' loss surface to conduct current while reducing losses.

Figure 5:
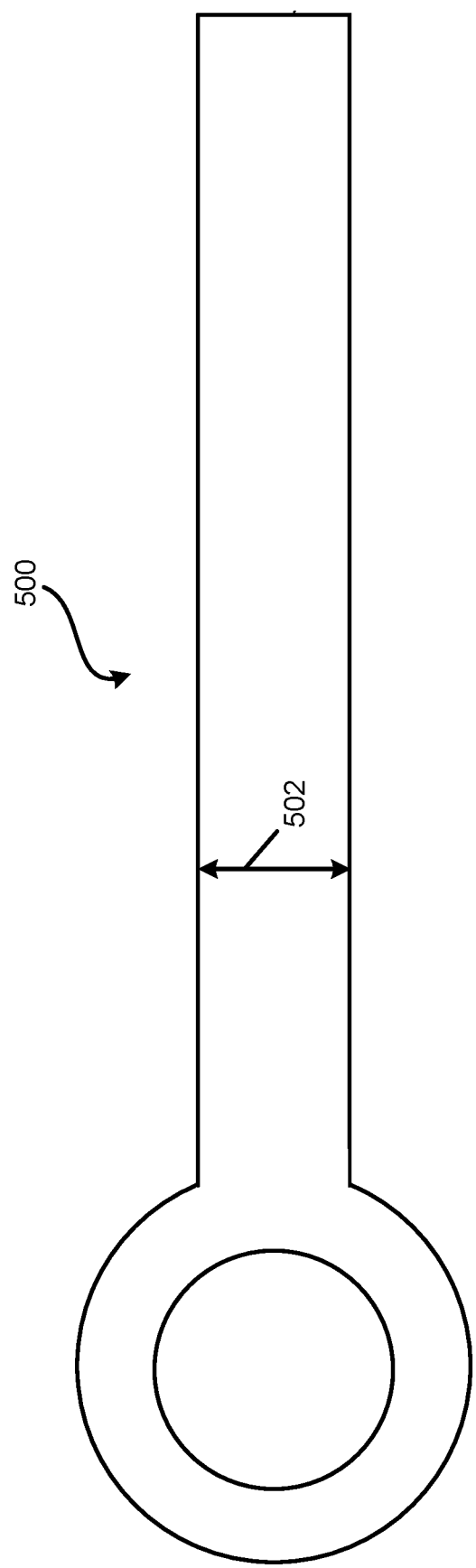
FIG. 5 is a top view of a conductor trace according to specific embodiments of the present disclosure.

FIG. 5 shows different examples of a conductor trace 500 according to specific embodiments of the present disclosure. In an example, a single conductor trace 500 may be routed on a PCB, such as PCB 202. In this example, conductor trace 500 may have a particular width 502, which may be any suitable width. Based on width 502, conductor trace 500 may provide a particular impedance to signal traveling along the conductor trace.

Figure 6:
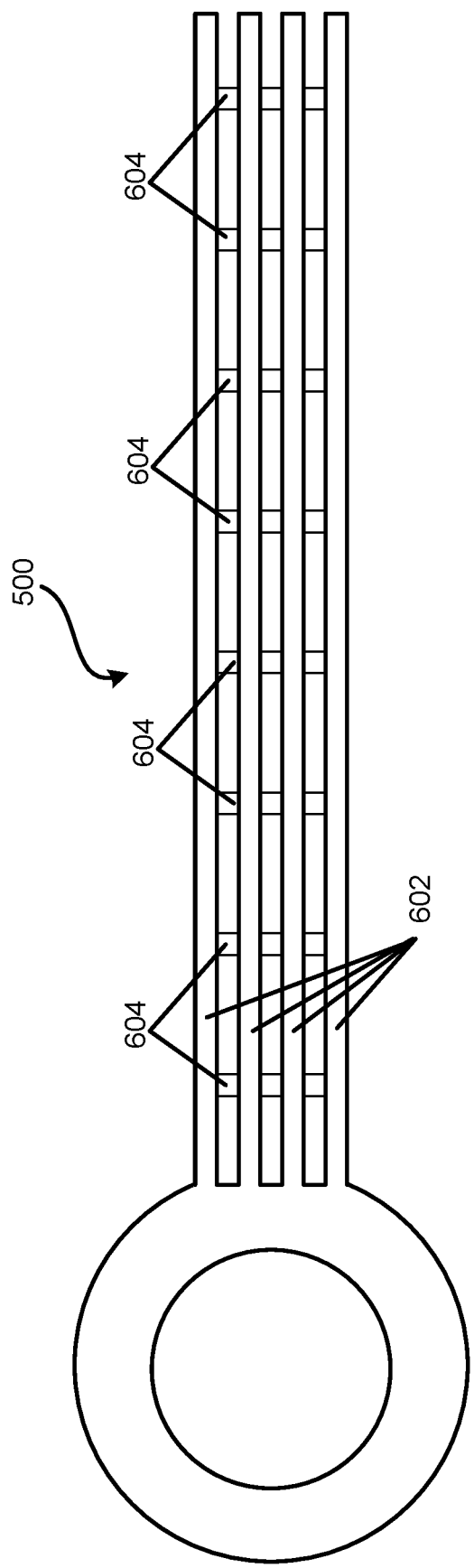
FIG. 6 is a top view of the conductor trace divided into a first embodiment of a plurality of split traces according to specific embodiments of the present disclosure.
Figure 7:
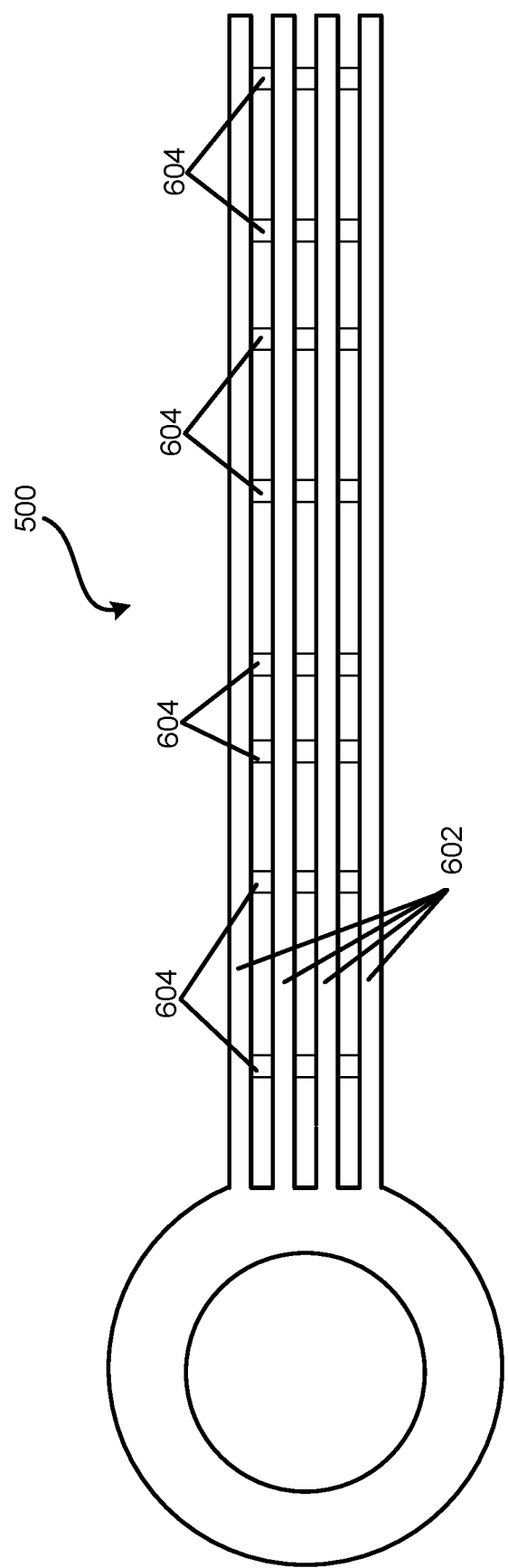
FIG. 7 is a top view of the conductor trace divided into a second embodiment of multiple split traces according to specific embodiments of the present disclosure.
Figure 8:
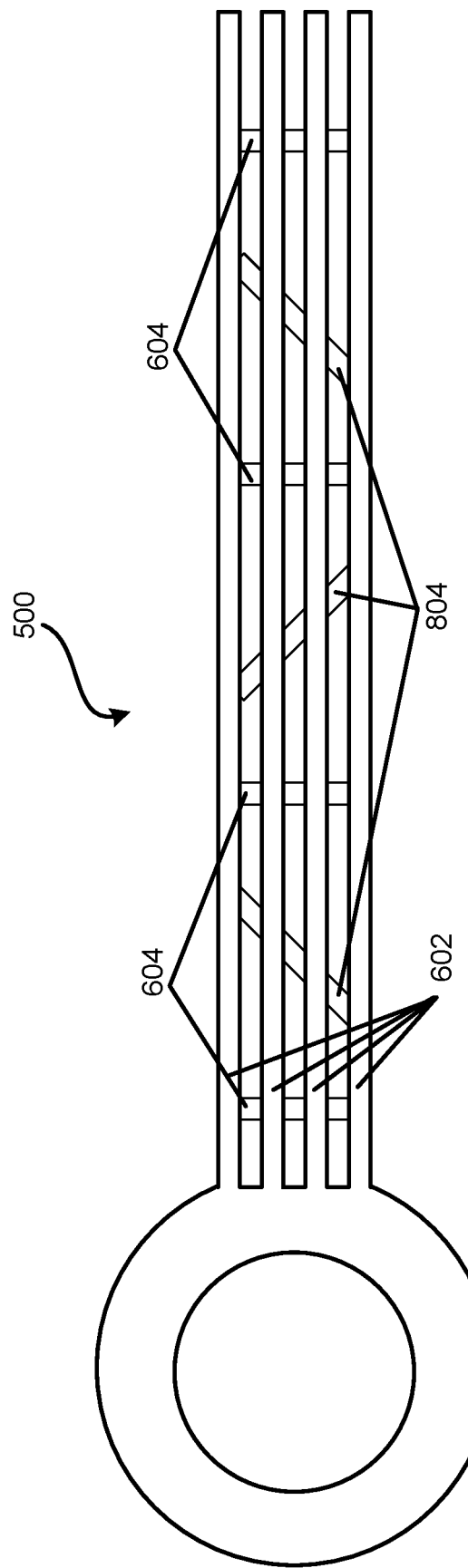
FIG. 8 is a top view of the conductor trace divided into a third embodiment of multiple split traces according to specific embodiments of the present disclosure.

In an example, conductor trace 500 may be provided on any suitable device or component. For example, conductor trace 500 may be located on a primary PCB, an integrated circuit package, a riser, a backplane, or the like of an information handling system. In an example, conductor trace 500 may be arranged with another conductor trace to electrically couple first and second complementary signals to provide differential signaling. Conductor trace 500 may cause dielectric loss and conductor loss to signals traveling along the conductor trace. In an example, conductor trace 500 may be one conductor trace of a differential pair and the improvements may to conductor trace 500 may also be provided to the other conductor trace of the differential pair, and any suitable number of other conductor traces without vary from the scope of this disclosure. FIGS. 6-8 show different embodiments of an improvement to conductor trace 500 to reduce the dielectric loss and the conductor loss.

FIG. 6 shows a first embodiment of conductor trace 500 divided into multiple split traces 602 according to specific embodiments of the present disclosure. In an example, conductor trace 500 may be divided into any suitable number of split traces including, but not limited to, two split traces, three split traces, and four split traces. In certain examples, each of split traces 602 may be substantially the same width, and the combination of the widths of the split traces and the widths between adjacent split traces may be substantially the same width as the original conductor trace 500. Thus, split traces 602 do not consume more board or routing area than the conductor trace. In certain examples, split traces 602 may increase conducting area as compared to a single trace of conductor trace 500. In an example, single conductor trace 500 may be divided into multiple split traces by any suitable method including, but not limited to, etching at least two splits within the conductor trace.

As described above, split traces 602 may improve the dielectric loss and the conductor loss of conductor trace 500. However, the combined impedance of split traces 602 may not be equal to conductor trace 500 before it was divided. In an example, the impedance change of split traces 602 may be any suitable amount including, but not limited to, +/−5%, +/−10%, and +/−15%. In certain examples, the impedance of conductor traces is important for high-speed signaling, such that the impedance of split traces 602 should substantially match the impedance of conductor trace 500 before the conductor trace was divided.

In an example, any suitable operation may be performed to match the impedance of split traces 602 to the impedance of conductor trace 500 before it was divided. For example, split traces 602 may be connected at multiple locations by tie bars 604. In an example, tie bars 604 may be arranged or oriented across split traces 602 in any suitable manner. For example, as shown in FIG. 6, tie bars 604 may be periodically connected to split traces 602, and the tie bars may be oriented in a perpendicular manner to all of the split traces. The periodicity of tie bars 604 may be any suitable distance including, but not limited to, every 25 mils, 50 mils, and 100 mils.

In an example, conductor trace 500, as shown in FIG. 6, may be utilized for transmitting high frequency signals based on tie bars 604 being perpendicular to split traces 602. The periodicity of tie bars 604 may affect a resonance frequency generated by the combination of split traces 602. For example, the smaller the periodicity of tie bars 604 the higher the resonance frequency generated, and the larger the periodicity of the tie bars the lower the resonance frequency. In an example, if the periodicity of tie bars 604 is substantially 100 mils, the resonance frequency is substantially equal to 30 GHz. If the periodicity of tie bars 604 is substantially 25 mils, the resonance frequency is substantially equal to 70 GHz.

FIG. 7 shows another embodiment of conductor trace 500 with tie bars 604 connecting split traces 602. In this embodiment, tie bars 604 may be all oriented in a perpendicular manner with respect to split traces 602. However, the resonance frequency of conductor trace 500 may be altered based on a random periodicity of tie bars 604. For example, the distances between adjacent tie bars 604 may vary from one pair of adjacent tie bars to the next pair. In an example, the random periodicity of tie bars 604 may lower a resonance intensity of the resonance frequency created by the tie bars and split traces 602.

FIG. 8 shows another embodiment of conductor trace 500 with tie bars 804 and 604 connecting split traces 602. In this embodiment, a first set of tie bars 604 may be oriented perpendicular to split traces 602, and a second set of tie bars 804 may be aligned in an angular orientation with respect to the split traces. In certain examples, the orientation or alignment of tie bars 604 and/or tie bars 804 may be selected based on a frequency range of the signals to be transmitted along split traces 602. For example, an orientation with one or more angled tie bars 804 and with one or more perpendicular tie bars 604 may utilized for split traces 602 that transmit low frequency signals.

Referring back to FIGS. 2, and 5-8, the configuration and dimensions of the traces shown at FIGS. 2 and 5 may provide a characteristic impedance of approximately 85 ohms, the same as provided by the configuration of FIGS. 6-8. As described below, the configuration of FIGS. 6-8 provides multiple advantages to the configuration of FIG. 5, including lower $I^2R$ losses, reduced coupling and crosstalk due to reduced electromagnetic fringing, and potentially greater route density.

Figure 9:
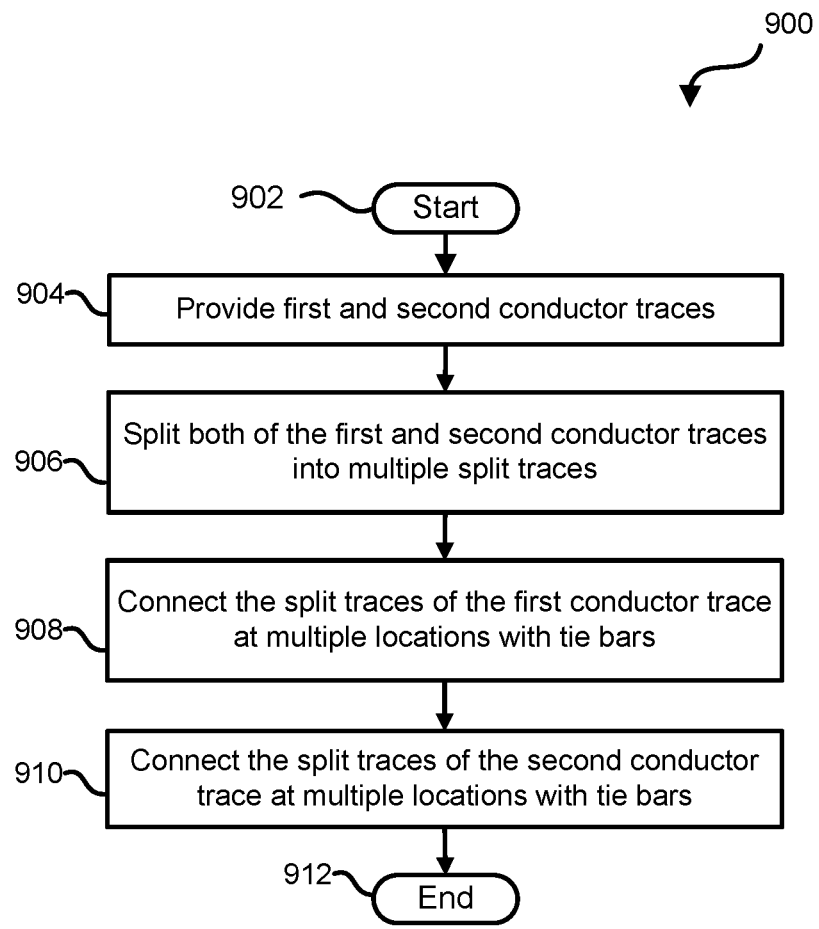
FIG. 9 shows a method for creating a split trace within the conductor trace according to a specific embodiment of the present disclosure.

FIG. 9 illustrates a method 900 for creating a split trace within the conductor trace according to a specific embodiment of the present disclosure, starting at block 902. It will be readily appreciated that not every method step set forth in this flow diagram is always necessary, and that certain steps of the methods may be combined, performed simultaneously, in a different order, or perhaps omitted, without varying from the scope of the disclosure. FIG. 9 may be employed in whole, or in part, an information handling system or any other type of system, controller, device, module, processor, or any combination thereof, operable to employ all, or portions of, the method of FIG. 9.

At block 904, two conductor traces are provided. In an example, the conductor traces may be provided on any suitable device or component. For example, the conductor traces may be located on a primary printed circuit board, an integrated circuit package, a riser, a backplane, or the like of an information handling system. In an example, the conductor traces may be arranged to electrically couple first and second complementary signals to provide differential signaling. In certain examples, the line-widths of both of the conductor traces may be any suitable width including, but not limited to, 6 mils, 8 mils, and 10 mils.

At block 906, both of the conductor traces are split into multiple split traces. In an example, each of the split traces are substantially the same width, and the combination of the widths of the split traces and the widths between adjacent split traces is substantially the same width of the original conductor trace. Thus, the split traces do not consume more board or routing area than the conductor trace. In an example, a single conductor trace is split into multiple split traces by etching at least two splits within the conductor trace.

At block 910, the split traces of the first conductor trace are connected at multiple locations by tie bars. At block 910, the split traces of the second conductor trace are similarly connected at multiple locations by tie bars, and the method ends at block 912. In an example, the tie bars may be arranged or oriented across the split traces of a particular conductor trace in any suitable manner. For example, the tie bars for one group of split traces may be perpendicular to all of the split traces of that group or conductor trace. In another example, a first set of the tie bars may be perpendicular to the split traces of a conductor trace, and a second set of tie bars may be aligned in an angular configuration with respect to the split traces of the same conductor trace.

In certain examples, the orientation or alignment of the tie bars may be selected based on a frequency range of the signals to be transmitted along the split traces. For example, an orientation with one or more angled tie bars and with one or more perpendicular tie bars may utilized for split traces that transmit low frequency signals. However, an orientation will all of the tie bars being perpendicular to the split traces may be utilized for split traces that transmit high frequency signals. In an example, the periodicity of the tie bars may be selected or controlled to change a resonance frequency generated by the combination of the tie bars and the split traces. For example, the smaller the periodicity of the tie bars the higher the resonance frequency generated, and the larger the periodicity of the tie bars the lower the resonance frequency.

In the above described flow chart of FIG. 9, one or more of the methods may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An apparatus comprising:
   a first conductor trace arranged to electrically couple a first complementary signal to a second complementary signal to provide differential signaling, wherein the first conductor trace has a first impedance and a first width when unsplit, the first conductor trace including:
      a first plurality of split traces to conduct the first complementary signal, wherein each of the split traces has a same width, wherein a combination of widths of the each of the split traces and widths between adjacent split traces is equal to the first width of the first conductor trace; and
      a first plurality of tie bars to connect the first split traces, wherein the first tie bars cause the first plurality of split traces to have a combined impedance substantially equal to the first impedance.

2. The apparatus of claim 1, further comprising:
   a second conductor trace arranged to electrically couple the second complementary signal to the first complementary signal to provide the differential signaling, the second conductor trace including:
      a second plurality of split traces to conduct the second complementary signal; and
      a second plurality of tie bars to connect the second split traces.

3. The apparatus of claim 1, wherein each of the first tie bars is perpendicular to each of the first plurality of split traces.

4. The apparatus of claim 1, wherein each of a first set of the first tie bars is perpendicular to each of the first plurality of split traces, and each of a second set of the first tie bars is angled with respect to each of the first plurality of split traces.

5. The apparatus of claim 1, wherein a periodicity of the first tie bars sets a resonance frequency of the first plurality of split traces.

6. The apparatus of claim 1, wherein each split between the first plurality of split traces is formed by the first conductor trace being etched.

7. The apparatus of claim 1, wherein the first conductor trace is included at a primary printed circuit board of an information handling system.

8. The apparatus of claim 1, wherein the first conductor trace is included at an integrated circuit package.

9. An apparatus comprising:
   a conductor trace arranged to electrically couple a first complementary signal to a second complementary signal to provide differential signaling, wherein the conductor trace has a first impedance and a first width when unsplit, the conductor trace including:
      a plurality of split traces including a first split trace, a second split trace, and a third split trace, the plurality of split traces to conduct the first complementary signal, wherein each of the plurality of split traces has a same width, wherein a combination of widths of the each of the split traces and widths between adjacent split traces is equal to the first width of the conductor trace; and
      a plurality of tie bars to connect the plurality of split traces, wherein a periodicity of the tie bars sets a resonance frequency of the plurality of split traces, wherein the tie bars cause the plurality of split traces to have a combined impedance substantially equal to the first impedance of the conductor trace.

10. The apparatus of claim 9, wherein each of the first tie bars is perpendicular to each of the plurality of split traces.

11. The apparatus of claim 9, wherein each of a first set of the tie bars is perpendicular to each of the plurality of split traces, and each of a second set of the tie bars is angled with respect to each of the plurality of split traces.

12. The apparatus of claim 9, wherein the conductor trace is included at a primary printed circuit board of an information handling system.

\* \* \* \* \*